(12) United States Patent
Ueda

(10) Patent No.: US 11,756,902 B2
(45) Date of Patent: Sep. 12, 2023

(54) HIGH-FREQUENCY MODULE

(71) Applicant: Murata Manufacturing Co., Ltd., Kyoto (JP)

(72) Inventor: Hideki Ueda, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 998 days.

(21) Appl. No.: 16/589,336

(22) Filed: Oct. 1, 2019

(65) Prior Publication Data

US 2020/0035626 A1    Jan. 30, 2020

Related U.S. Application Data

(63) Continuation of application No. PCT/JP2018/007632, filed on Feb. 28, 2018.

(30) Foreign Application Priority Data

Apr. 3, 2017   (JP) .................................. 2017-073390

(51) Int. Cl.
*H01L 23/66*   (2006.01)
*H01Q 5/378*   (2015.01)
(Continued)

(52) U.S. Cl.
CPC .............. *H01L 23/66* (2013.01); *H01Q 1/48* (2013.01); *H01Q 1/526* (2013.01); *H01Q 5/378* (2015.01);
(Continued)

(58) Field of Classification Search
CPC ........... H01L 23/5389; H01L 23/49805; H01L 23/552; H01L 2223/6677; H01Q 9/0407; H01Q 1/526; H01Q 1/2283
See application file for complete search history.

(56) References Cited

U.S. PATENT DOCUMENTS 5,886,876 A * 3/1999 Yamaguchi ......... H01L 23/3128
  361/767
7,633,765 B1 * 12/2009 Scanlan .............. H01L 23/5389
  174/262
(Continued)

FOREIGN PATENT DOCUMENTS

JP    S49-084766 A    8/1974
JP    H11-266172 A    9/1999
(Continued)

OTHER PUBLICATIONS

International Search Report for International Application No. PCT/JP2018/007632 dated Jun. 5, 2018.
(Continued)

*Primary Examiner* — Ricardo I Magallanes

(74) *Attorney, Agent, or Firm* — Pearne & Gordon LLP

(57) ABSTRACT

A ground plane is disposed in a dielectric substrate or on the top surface of the dielectric substrate. A high-frequency semiconductor device is mounted on the bottom surface of the dielectric substrate. A shield structure that is provided in a space closer to the bottom surface than the ground plane is surrounds the high-frequency semiconductor device from below and sideways of the high-frequency semiconductor device and is connected to the ground plane. An opening is formed in the shield structure. A radiation-structure portion causes a high-frequency signal output by the high-frequency semiconductor device to be radiated through the opening.

12 Claims, 11 Drawing Sheets

(51) Int. Cl.
  *H01Q 1/48* (2006.01)
  *H01Q 1/52* (2006.01)
  *H01Q 13/08* (2006.01)
  *H01Q 13/10* (2006.01)
  *H01Q 23/00* (2006.01)

(52) U.S. Cl.
  CPC ............ *H01Q 13/08* (2013.01); *H01Q 13/10* (2013.01); *H01Q 23/00* (2013.01); *H01L 2223/6677* (2013.01)

(56) References Cited

U.S. PATENT DOCUMENTS

| | | | | |
|---|---|---|---|---|
| 7,649,252 B2* | 1/2010 | Sakai | H01L 25/165 | 257/703 |
| 8,199,518 B1* | 6/2012 | Chun | H01L 23/3128 | 361/767 |
| 11,063,340 B2* | 7/2021 | Kuroda | H01Q 5/335 | |
| 2001/0021643 A1 | 9/2001 | Itoh | | |
| 2001/0026864 A1* | 10/2001 | Mori | C03C 8/14 | 428/209 |
| 2002/0167060 A1* | 11/2002 | Buijsman | H01Q 1/2291 | 257/E23.114 |
| 2003/0201938 A1* | 10/2003 | Dening | H01Q 15/008 | 343/846 |
| 2004/0040740 A1* | 3/2004 | Nakatani | H01L 21/568 | 29/832 |
| 2004/0080044 A1* | 4/2004 | Moriyama | H01L 23/49838 | 257/691 |
| 2004/0137972 A1* | 7/2004 | Kishimoto | H03H 9/72 | 455/575.8 |
| 2004/0231879 A1* | 11/2004 | Ebihara | H01L 23/552 | 174/532 |
| 2004/0232452 A1* | 11/2004 | Tsuneoka | H01L 23/60 | 257/E23.125 |
| 2005/0013082 A1* | 1/2005 | Kawamoto | H05K 3/3452 | 257/E21.511 |
| 2005/0042804 A1* | 2/2005 | Kim | H03H 3/08 | 438/110 |
| 2005/0088260 A1* | 4/2005 | Ajioka | H01Q 1/2283 | 257/E23.114 |
| 2005/0285794 A1* | 12/2005 | Tang | H01L 23/04 | 257/E23.181 |
| 2008/0088510 A1* | 4/2008 | Murata | H01Q 3/24 | 343/876 |
| 2008/0191956 A1* | 8/2008 | Watanabe | H01Q 23/00 | 257/679 |
| 2009/0231225 A1 | 9/2009 | Choudhury et al. | | |
| 2009/0308653 A1* | 12/2009 | Wu | H01Q 1/526 | 361/818 |
| 2009/0322643 A1* | 12/2009 | Choudhury | H01Q 21/0025 | 343/851 |
| 2010/0201580 A1* | 8/2010 | Goldberger | H01Q 1/2283 | 343/700 MS |
| 2011/0026234 A1* | 2/2011 | Kim | H05K 1/0236 | 361/818 |
| 2011/0134010 A1* | 6/2011 | Toyao | H01P 5/028 | 343/848 |
| 2011/0299264 A1* | 12/2011 | Kim | H05K 1/0236 | 361/818 |
| 2012/0007786 A1* | 1/2012 | Ando | H01Q 9/0457 | 343/905 |
| 2012/0032865 A1* | 2/2012 | Toyao | H01Q 15/008 | 343/834 |
| 2012/0062439 A1* | 3/2012 | Liao | H01L 25/16 | 29/25.01 |
| 2012/0212384 A1* | 8/2012 | Kam | H01Q 1/2283 | 343/834 |
| 2013/0015564 A1 | 1/2013 | Matsuki et al. | | |
| 2013/0222196 A1* | 8/2013 | Hashimoto | H01Q 23/00 | 343/700 MS |
| 2013/0223041 A1* | 8/2013 | Arnold | H01L 23/552 | 29/874 |
| 2013/0225102 A1* | 8/2013 | Tsutsumi | H01Q 23/00 | 257/E31.11 |
| 2014/0028518 A1* | 1/2014 | Arnold | H01Q 1/2283 | 343/841 |
| 2014/0035097 A1* | 2/2014 | Lin | H01L 23/66 | 257/E29.325 |
| 2014/0126168 A1* | 5/2014 | Fujita | H05K 1/0298 | 361/777 |
| 2014/0145883 A1* | 5/2014 | Baks | H01L 23/66 | 343/700 MS |
| 2014/0239465 A1* | 8/2014 | Yen | H01L 24/97 | 257/659 |
| 2014/0247195 A1* | 9/2014 | Yen | H01L 23/66 | 343/873 |
| 2014/0252595 A1* | 9/2014 | Yen | H01L 23/498 | 257/737 |
| 2015/0022418 A1* | 1/2015 | Azuma | H04B 1/0458 | 343/850 |
| 2015/0194388 A1* | 7/2015 | Pabst | H01L 21/768 | 257/659 |
| 2015/0263421 A1* | 9/2015 | Chiu | H01L 23/66 | 29/601 |
| 2015/0303562 A1* | 10/2015 | Chen | H01Q 1/526 | 29/601 |
| 2015/0381229 A1* | 12/2015 | Tzanidis | H01Q 9/0457 | 455/73 |
| 2016/0149300 A1* | 5/2016 | Ito | H01Q 1/526 | 427/58 |
| 2016/0240493 A1* | 8/2016 | Lee | H01L 23/3128 | |
| 2017/0033062 A1* | 2/2017 | Liu | H01L 23/528 | |
| 2017/0194271 A1* | 7/2017 | Hsu | H01L 23/552 | |
| 2017/0222316 A1 | 8/2017 | Mizunuma et al. | | |
| 2017/0229769 A1* | 8/2017 | Yokoyama | H01L 25/16 | |
| 2017/0324135 A1* | 11/2017 | Blech | H01Q 1/38 | |
| 2018/0159203 A1* | 6/2018 | Baks | H01Q 1/48 | |
| 2018/0247905 A1* | 8/2018 | Yu | H01Q 9/0457 | |
| 2018/0323159 A1* | 11/2018 | Kamgaing | H01L 23/66 | |
| 2019/0088603 A1* | 3/2019 | Marimuthu | H01L 23/528 | |
| 2019/0115643 A1* | 4/2019 | Khan | H01Q 9/42 | |
| 2019/0139915 A1* | 5/2019 | Dalmia | H01L 23/552 | |
| 2019/0341363 A1* | 11/2019 | Yu | H01L 23/5384 | |
| 2020/0168592 A1* | 5/2020 | Cheah | H01L 25/16 | |
| 2020/0219832 A1* | 7/2020 | Marimuthu | H01L 21/568 | |
| 2021/0225786 A1* | 7/2021 | Yu | H01L 24/29 | |
| 2021/0280964 A1* | 9/2021 | Hong | H01Q 21/28 | |

FOREIGN PATENT DOCUMENTS

| | | |
|---|---|---|
| JP | 2001-251118 A | 9/2001 |
| JP | 2003-188639 A | 7/2003 |
| JP | 2004-165854 A | 6/2004 |
| JP | 2005-051576 A | 2/2005 |
| JP | 2007-157891 A | 6/2007 |
| JP | 2011-517394 A | 6/2011 |
| JP | 2013-21628 A | 1/2013 |
| JP | 2013-179152 A | 9/2013 |
| WO | WO-2015122203 A1 * | 8/2015 ............ H01Q 1/526 |
| WO | 2016/063759 A1 | 4/2016 |

OTHER PUBLICATIONS

Written Opinion for International Application No. PCT/JP2018/007632 dated Jun. 5, 2018.

* cited by examiner

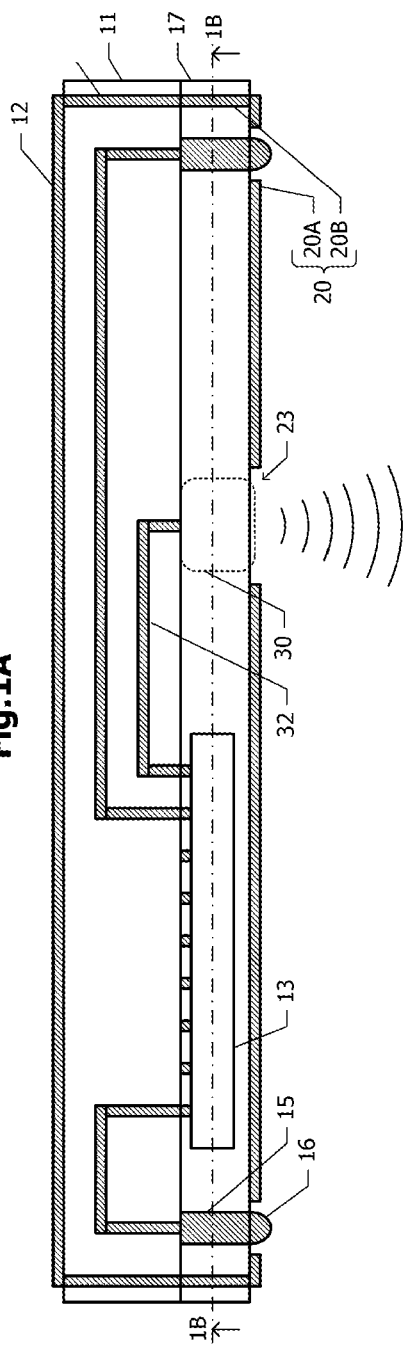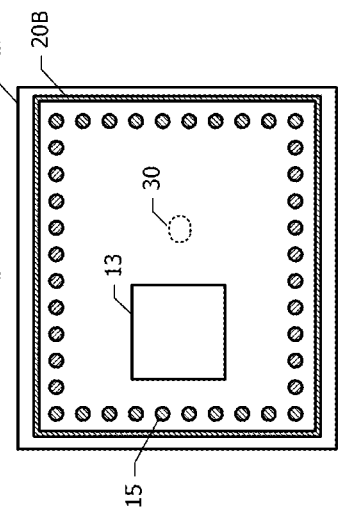

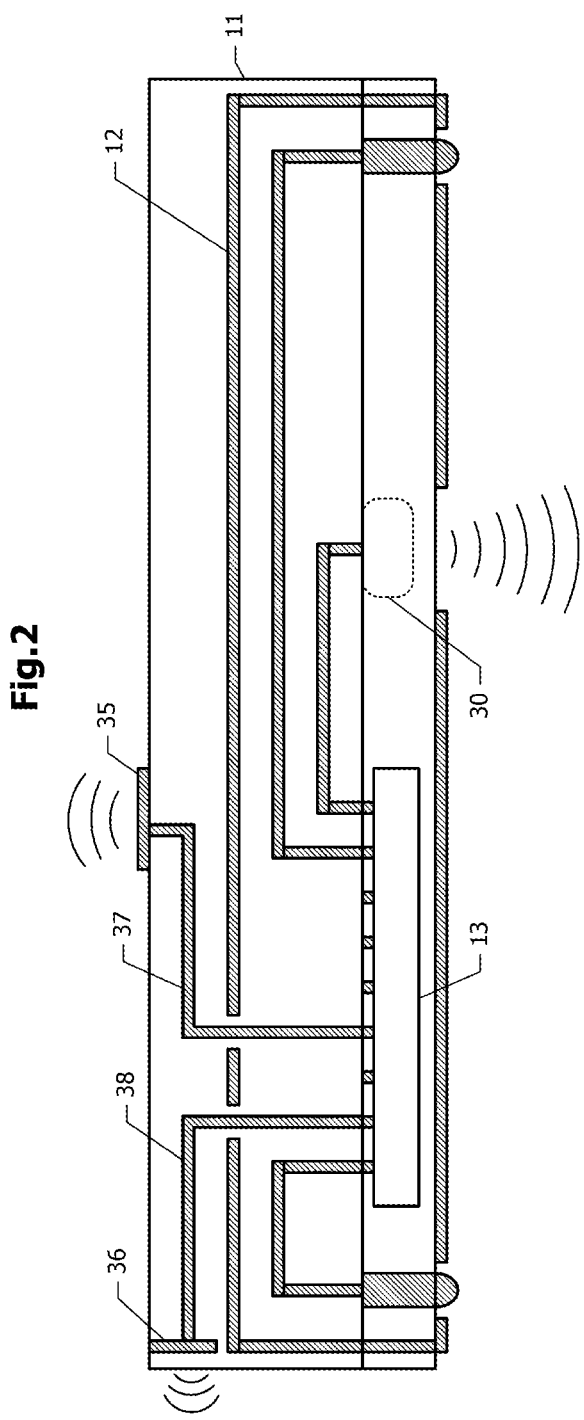

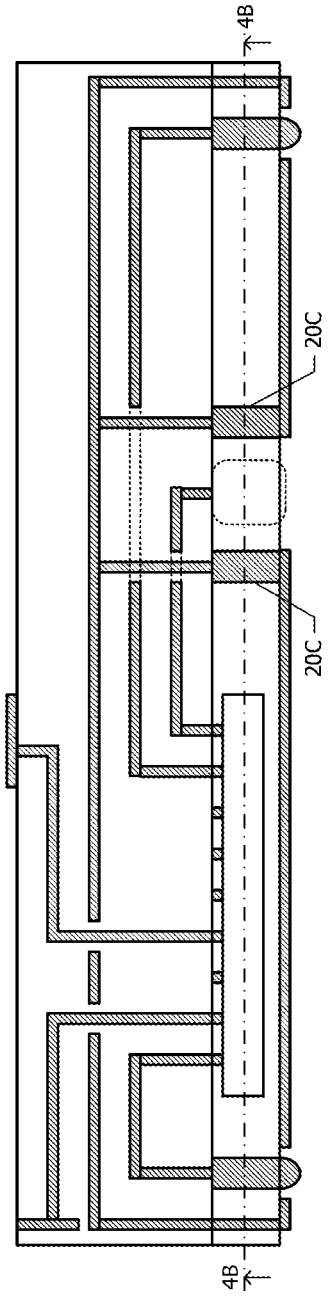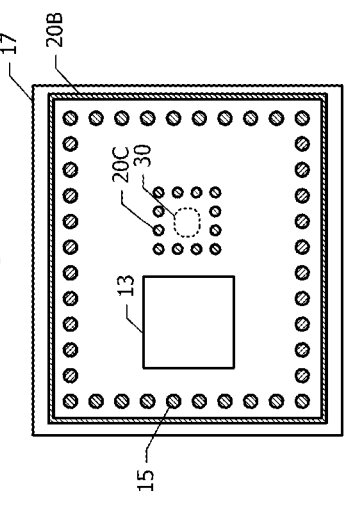

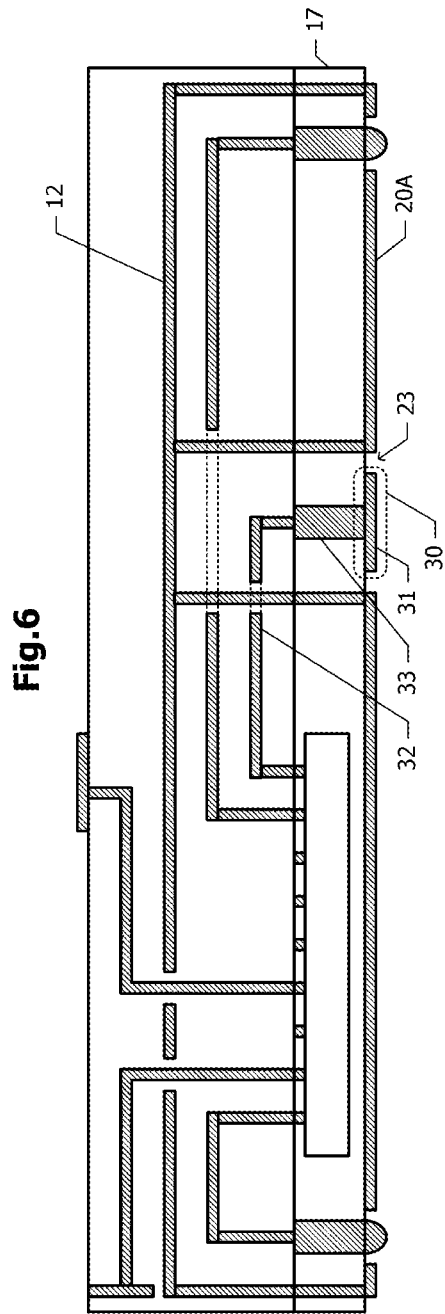

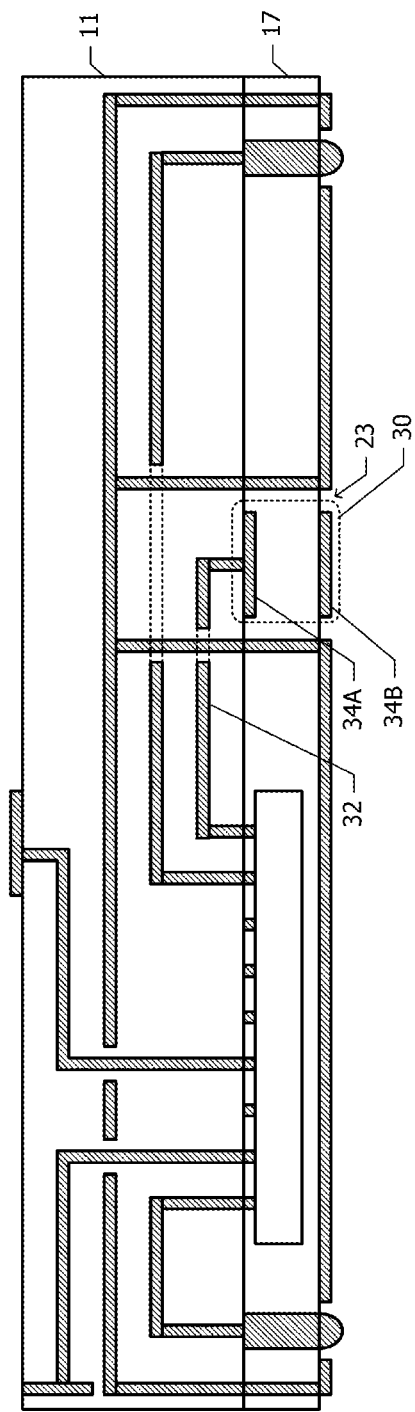

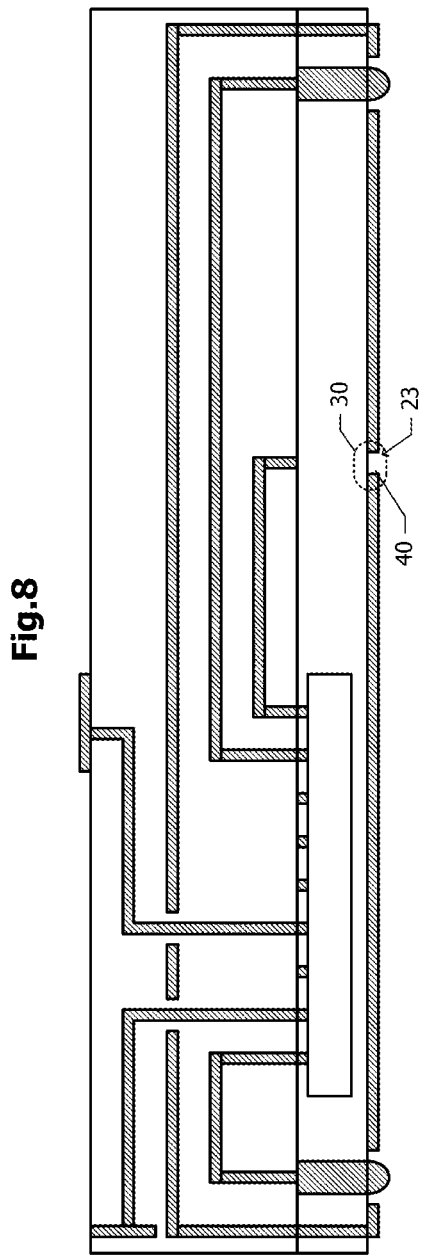

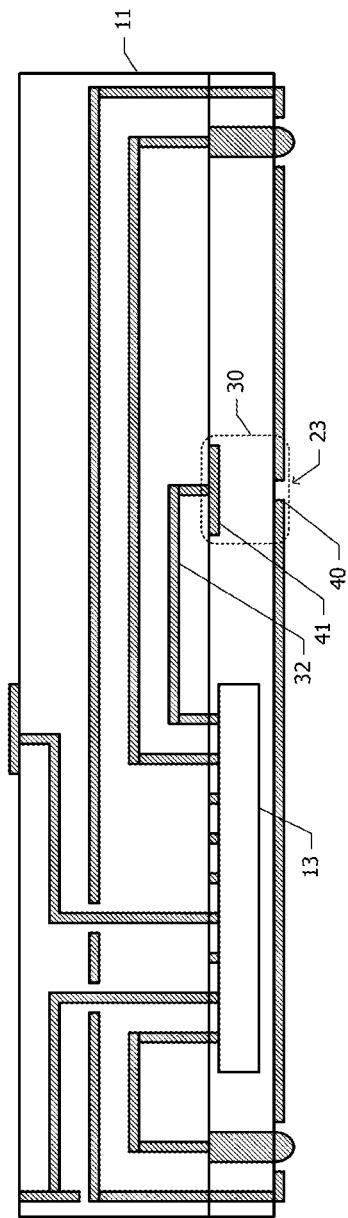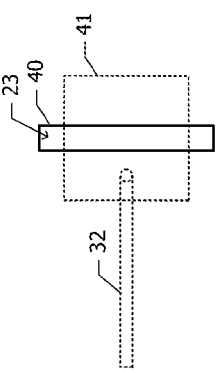

HIGH-FREQUENCY MODULE

This is a continuation of International Application No. PCT/JP2018/007632 filed on Feb. 28, 2018 which claims priority from Japanese Patent Application No. 2017-073390 filed on Apr. 3, 2017. The contents of these applications are incorporated herein by reference in their entireties.

BACKGROUND OF THE DISCLOSURE

Field of the Disclosure

The present disclosure relates to a high-frequency module.

Description of the Related Art

There have been proposed various high-frequency modules each of which is formed by modularizing an antenna and a high-frequency semiconductor device (Patent Document 1, Patent Document 2, Patent Document 3, and the like).

The device disclosed in Patent Document 1 includes a semiconductor device that is mounted on a circuit board. A shield layer that blocks electromagnetic waves is provided on the top surface of the semiconductor device, and an antenna element is provided above the shield layer. The antenna element is electrically connected to the top surface of the semiconductor device by a connecting portion extending through the shield layer. As a result, a small-sized semiconductor device that has a shielding function for electromagnetic waves and an antenna function is realized.

In another device disclosed in Patent Document 1, a semiconductor device that includes a shield layer provided on the top surface thereof is mounted on a module substrate. An antenna element that is provided on the shield layer is electrically connected to the semiconductor device by a connecting portion, which is disposed beside the semiconductor device, and the module substrate. The semiconductor device and the connecting portion between the module substrate and the antenna element are sealed by a sealing resin.

Patent Document 2 discloses a circuit module on which circuit components including a power amplifier transistor and the like are mounted. In the circuit module, an insulating resin layer is formed on the entire top surface of a module substrate, on which the circuit components have been mounted, such that the circuit components are enclosed in the insulating resin layer. A side-surface shield plate having a frame-like shape is mounted on the module substrate so as to surround the circuit components and is embedded in the insulating resin layer. A top-surface shield layer is formed on the top surface of the insulating resin layer.

In the wireless communication module disclosed in Patent Document 3, a ground layer is provided in a dielectric substrate. A high-frequency device is mounted on a surface below the ground layer. An antenna pattern is disposed above the ground layer. A plurality of signal conductor columns and a plurality of ground conductor columns projected from the surface on which the high-frequency device is mounted. The signal conductor columns are connected to the high-frequency device, and the ground conductor columns are connected to the ground layer. The ends of the signal conductor column and the ground conductor column are electrically connected to the terminals of a mounting substrate.

Patent Document 1: Japanese Unexamined Patent Application Publication No. 2013-21628

Patent Document 2: Japanese Unexamined Patent Application Publication No. 2007-157891

Patent Document 3: International Publication No. 2016/063759

BRIEF SUMMARY OF THE DISCLOSURE

In the device disclosed in Patent Document 1, the semiconductor device and the antenna element are disposed on the opposite sides of the shield layer. Thus, the device has a structure in which the semiconductor device, the shield layer, and the antenna element are stacked on top of one another. Consequently, it is difficult to reduce the thickness of the entire device to be smaller than the sum of the thicknesses of the semiconductor device, the shield layer, and the antenna element.

The circuit module disclosed in Patent Document 2 is not provided with an antenna element. Thus, an antenna element needs to be prepared separately from the circuit module, and it is necessary to connect the antenna element and the circuit module to each other.

In the wireless communication module disclosed in Patent Document 3, the high-frequency device is not shielded.

It is an object of the present disclosure to provide a high-frequency module capable of shielding a high-frequency semiconductor device and capable of being reduced in size.

A high-frequency module according to a first aspect of the present disclosure includes a dielectric substrate, a ground plane that is provided in the dielectric substrate or on a top surface of the dielectric substrate, a high-frequency semiconductor device that is mounted on a bottom surface of the dielectric substrate, a shield structure that is provided in a space closer to the bottom surface than the ground plane is and that surrounds the high-frequency semiconductor device from below and sideways of the high-frequency semiconductor device, the shield structure being connected to the ground plane and having an opening, a radiation-structure portion that causes a high-frequency signal output by the high-frequency semiconductor device to be radiated as electromagnetic waves through the opening, and an upper radiating element provided at a portion of the dielectric substrate above the ground plane and driven by the high-frequency semiconductor device.

A high-frequency semiconductor device can be shielded by a ground plane and a shield structure. When viewed from a ground plane that functions as a shield layer, a high-frequency semiconductor device and a radiation-structure portion are disposed on the same side, and thus, a reduction in the size of a high-frequency module can be achieved.

BRIEF DESCRIPTION OF THE SEVERAL VIEWS OF THE DRAWINGS

FIG. 1A is a sectional view of a high-frequency module according to a first embodiment, and FIG. 1B is a plan sectional view taken along one-dot chain line 1B-1B of FIG. 1A.

FIG. 2 is a sectional view of a high-frequency module according to a second embodiment.

FIG. 4A is a sectional view of a high-frequency module according to a modification of the third embodiment, and FIG. 4B is a plan sectional view taken along one-dot chain line 4B-4B of FIG. 4A.

FIG. 6 is a sectional view of a high-frequency module according to a fifth embodiment.

FIG. 7 is a sectional view of a high-frequency module according to a sixth embodiment.

FIG. 8 is a sectional view of a high-frequency module according to a seventh embodiment.

FIG. 9A is a sectional view of a high-frequency module according to an eighth embodiment, and FIG. 9B is a bottom view of a slot antenna portion of the high-frequency module according to the eighth embodiment.

DETAILED DESCRIPTION OF THE DISCLOSURE

First Embodiment

Figure 3A:
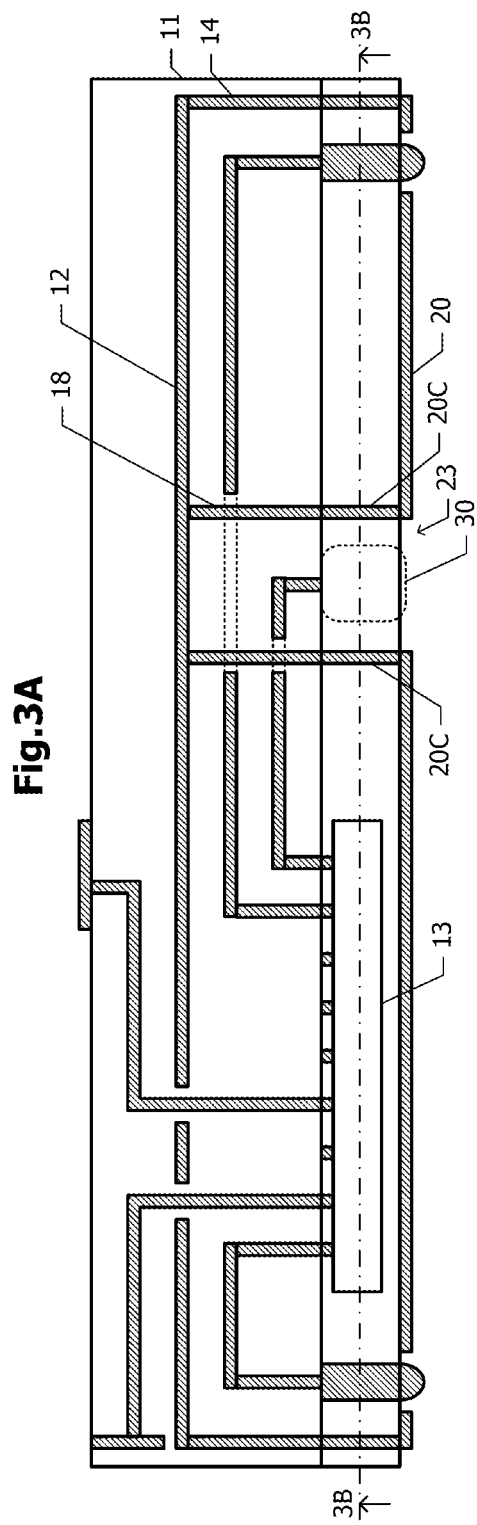
FIG. 3A is a sectional view of a high-frequency module according to a third embodiment.

A high-frequency module according to a first embodiment will be described with reference to FIG. 1A and FIG. 1B.

FIG. 1A is a sectional view of the high-frequency module according to the first embodiment. A ground plane (ground pattern) 12 is disposed on a first surface (hereinafter referred to as "top surface") of a dielectric substrate 11. A high-frequency semiconductor device 13 and other passive elements are mounted on a second surface (hereinafter referred to as "bottom surface") of the dielectric substrate 11. In the present specification, the direction in which the top surface of the dielectric substrate 11 is oriented and the direction in which the bottom surface of the dielectric substrate 11 is oriented are respectively defined as an upward direction and a downward direction, and the direction that is perpendicular to the upward and downward directions is defined as a lateral direction. Note that a region located at an upper position relative to a reference position, a region located at a lower position relative to the reference position, and a region located at a lateral position relative to the reference position may sometimes be simply referred to as an upper region, a lower region, and a side region, respectively. A plurality of conductor columns 15 extend downward from the bottom surface of the dielectric substrate 11. The plurality of conductor columns 15 are connected to the high-frequency semiconductor device 13 by wiring lines and via conductors that are provided in the dielectric substrate 11.

A sealing-resin layer 17 is formed on the bottom surface of the dielectric substrate 11. The high-frequency semiconductor device 13 and the conductor columns 15 are embedded in the sealing-resin layer 17. The high-frequency semiconductor device 13 is completely covered with the sealing-resin layer 17, and the plurality of conductor columns 15 reach a surface (bottom surface) of the sealing-resin layer 17. Input/output terminals 16 are disposed at ends of the conductor columns 15.

A shield structure 20 is provided in a space closer to the bottom surface than the ground plane 12 is and surrounds the high-frequency semiconductor device 13 and the other passive elements from below and from the side. The shield structure 20 is connected to the ground plane 12 by a plurality of via conductors 14 extending in the dielectric substrate 11 in a thickness direction. The shield structure 20 includes a planar first portion 20A that is disposed below the high-frequency semiconductor device 13 and a frame-shaped second portion 20B surrounding the high-frequency semiconductor device 13 from the side. The first portion 20A is disposed so as to be parallel to the bottom surface of the dielectric substrate 11. The second portion 20B connects the first portion 20A and the via conductors 14 to each other.

A lower portion and a side portion of the high-frequency semiconductor device 13 are shielded by the shield structure 20, and an upper portion of the high-frequency semiconductor device 13 is shielded by the ground plane 12. The plurality of via conductors 14 that connect the ground plane 12 and the shield structure 20 to each other are arranged so as to surround the high-frequency semiconductor device 13 when viewed in a plan view. The pitch of the plurality of via conductors 14 is set to be narrow enough at a level that, in a frequency range of electromagnetic waves to be radiated from the high-frequency module, the via conductors 14 can be considered to be substantially continuous with one another in the direction in which the via conductors 14 are arranged. Thus, also the plurality of via conductors 14 have a shielding function in the frequency range of the electromagnetic waves to be radiated from the high-frequency module.

At least one opening 23 is formed in the first portion 20A. A radiation-structure portion 30 is disposed in a space surrounded by the shield structure 20, the ground plane 12, and the peripheral via conductors 14 or on the same plane as the opening 23. A high-frequency signal is transmitted from the high-frequency semiconductor device 13 to the radiation-structure portion 30 through a transmission line 32 that is disposed in the dielectric substrate 11. The radiation-structure portion 30 causes a high-frequency signal output by the high-frequency semiconductor device 13 to be emitted as electromagnetic waves from the opening 23. Here, the term "from the opening 23" includes a situation in which electromagnetic waves pass through the opening 23 and a situation in which the opening 23 serves as an emitter.

FIG. 1B is a plan sectional view taken along one-dot chain line 1B-1B of FIG. 1A. The high-frequency semiconductor device 13 is sealed in the sealing-resin layer 17. The radiation-structure portion 30 is disposed at a position different from that of the high-frequency semiconductor device 13. The plurality of conductor columns 15 surround the high-frequency semiconductor device 13 and the radiation-structure portion 30 from sideways. For example, the plurality of conductor columns 15 are arranged along the outer periphery of an imaginary rectangle. The second portion 20B of the shield structure 20 is positioned outside a region in which the plurality of conductor columns 15 are arranged. The second portion 20B surrounds the region in which the plurality of conductor columns 15 are arranged. For example, when viewed in a plan view, the second portion 20B has a shape that follows the outer peripheral line of an imaginary rectangle.

A method of manufacturing the high-frequency module according to the first embodiment, which is illustrated in FIGS. 1A and 1B, will now be described. The dielectric substrate 11 that is provided with the ground plane 12, the via conductors 14, the transmission line 32, and so forth is manufactured by using a method of manufacturing a common printed wiring board. The high-frequency semiconductor device 13, other circuit components, the conductor columns 15, and the frame-shaped second portion 20B of the shield structure 20 are mounted onto the dielectric substrate 11. A solder reflow technique can be used for mounting these components.

After the components have been mounted on the bottom surface of the dielectric substrate 11, a liquid resin is applied to the bottom surface of the dielectric substrate 11. By solidifying the applied liquid resin, the sealing-resin layer 17 is formed. Subsequently, an outer layer portion of the sealing-resin layer 17 is ground, so that the top surfaces of the conductor columns 15 and the top surface of the second portion 20B are exposed. After grinding the sealing-resin layer 17, the first portion 20A of the shield structure 20 is formed. In addition, the input/output terminals 16 are formed on the top surfaces of the conductor columns 15, which have been exposed. Lastly, the dielectric substrate 11 and the sealing-resin layer 17 are separated into units of high-frequency modules.

Advantageous effects of the first embodiment illustrated in FIGS. 1A and 1B will now be described. In the first embodiment, the high-frequency semiconductor device 13 that supplies a high-frequency signal to the radiation-structure portion 30, the other passive elements, and the transmission line that connects these components to one another are arranged in the space surrounded by the ground plane 12, the via conductors 14, and the shield structure 20. Thus, electromagnetic noise that enters the high-frequency semiconductor device 13 and the like from all directions and electromagnetic noise that is emitted in all directions can be blocked.

In addition, in the first embodiment, electromagnetic waves can be radiated in the downward direction with respect to the dielectric substrate 11, which is, for example, the direction in which the bottom surface, on which the high-frequency semiconductor device 13 is mounted, is oriented. In the case of causing the directivity to be oriented in the downward direction with respect to the dielectric substrate 11, the first portion 20A of the shield structure 20 is typically used as a ground of an antenna, and a radiating element is disposed below the shield structure 20. In this structure, the three structures, which are the high-frequency semiconductor device 13, the shield structure 20, and the radiating element, are stacked on top of one another.

In contrast, in the first embodiment, the radiation-structure portion 30 is disposed on the same side as the high-frequency semiconductor device 13 with respect to the shield structure 20. Therefore, a reduction in the size of the high-frequency module can be achieved.

In the case of causing electromagnetic waves to be radiated through the opening 23, it is preferable to set a dimension of the opening 23 to be not less than one-half of the effective wavelength of the electromagnetic waves to be radiated in order to suppress the reduction of the radiation efficiency. For example, in the case where the opening 23 has a square shape, the length of one side of the square shape may be set to be not less than one-half of the effective wavelength.

When the opening 23 is too large, the shielding effect against the electromagnetic noise in a frequency range to be blocked is decreased. For example, it is preferable to set the dimension of the opening 23 to be not more than one half of an effective wavelength that corresponds to either the frequency of an intermediate-frequency signal used for the operation of the high-frequency semiconductor device 13 or the frequency of a local signal, whichever is higher. By setting the dimension of the opening 23 in this manner, the electromagnetic noise in the frequency range of the intermediate-frequency signal and in the frequency range of the local signal can be effectively blocked.

Second Embodiment

A high-frequency module according to a second embodiment will now be described with reference to FIG. 2. The description of the configuration common to the high-frequency module according to the first embodiment (FIGS. 1A and 1B) will be omitted.

FIG. 2 is a sectional view of a high-frequency module according to the second embodiment. In the second embodiment, upper radiating elements 35 and 36 are provided at portions above the ground plane 12 (portions on the side opposite to the side on which the radiation-structure portion 30 is disposed with the ground plane 12 interposed between the portions and the radiation-structure portion 30). For example, the ground plane 12 is disposed at an inner layer of the dielectric substrate 11, and the upper radiating element 35 is disposed on the top surface of the dielectric substrate 11. The upper radiating element 36 is disposed in the dielectric substrate 11 so as to be located above the ground plane 12. For example, the upper radiating element 35 is a patch antenna, and the upper radiating element 36 is a monopole antenna.

The upper radiating element 35 is connected to the high-frequency semiconductor device 13 by a transmission line 37 that is disposed in the dielectric substrate 11, and the upper radiating element 36 is connected to the high-frequency semiconductor device 13 by a transmission line 38 that is disposed in the dielectric substrate 11. The upper radiating elements 35 and 36 are driven by the high-frequency semiconductor device 13. Each of the transmission lines 37 and 38 extends from a space above the ground plane 12 to a space below the ground plane 12 by passing through an opening formed in the ground plane 12.

In the second embodiment, the radiation-structure portion 30, the upper radiating element 35, and the upper radiating element 36 respectively radiate electromagnetic waves in the upward direction, the downward direction, and the lateral direction with respect to the high-frequency module. As described above, the high-frequency module according to the second embodiment can radiate electromagnetic waves in a plurality of directions including the upward direction, the downward direction, and the lateral direction.

Note that only one of the upper radiating elements 35 and 36 may be provided. For example, the high-frequency module that includes the upper radiating element 35 can radiate electromagnetic waves in the downward direction and the upward direction. The high-frequency module that includes the upper radiating element 36 can radiate electromagnetic waves in the downward direction and the lateral direction.

Third Embodiment

A high-frequency module according to a third embodiment will now be described with reference to FIG. 3A and FIG. 3B. The description of the configuration common to the high-frequency module according to the second embodiment (FIG. 2) will be omitted.

Figure 3B:
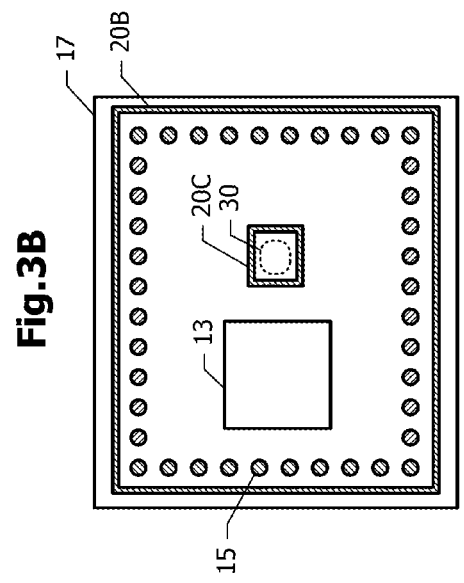
FIG. 3B is a plan sectional view taken along one-dot chain line 3B-3B of FIG. 3A.

FIG. 3A is a sectional view of the high-frequency module according to the third embodiment, and FIG. 3B is a plan sectional view taken along one-dot chain line 3B-3B of FIG. 3A. In the third embodiment, the shield structure 20 includes a third portion 20C that has a hollow cylindrical shape extending from the edge of the opening 23 to the bottom surface of the dielectric substrate 11. Although FIG. 3B illustrates a case where the third portion 20C has a square cylindrical shape, the third portion 20C may have a circular cylindrical shape. The third portion 20C is connected to the ground plane 12 by a plurality of via conductors 18 that are arranged in the dielectric substrate 11. When viewed in a plan view, the third portion 20C substantially coincides with the outer peripheral line of the opening 23. When viewed in a plan view, the plurality of via conductors 18 are discretely arranged along the cylindrical third portion 20C. The pitch of the plurality of via conductors 18 is set to be narrow enough at a level that, in a frequency range of electromagnetic waves to be radiated from the high-frequency module, the via conductors 18 can be considered to be substantially continuous with one another in the direction in which the via conductors 18 are arranged, and the pitch of the plurality of via conductors 18 is set to be, for example, one-quarter of a wavelength.

The high-frequency semiconductor device 13 is disposed in a space shielded by the shield structure 20, the ground plane 12, and the via conductors 14 and 18. When viewed in a plan view, the radiation-structure portion 30 is disposed in a region surrounded by the cylindrical third portion 20C, that is, outside the shielded space.

In the third embodiment, by providing the cylindrical third portion 20C and the plurality of via conductors 18, the shielding effect can be further improved than that in each of the first and second embodiments.

A high-frequency module according to a modification of the third embodiment will now be described with reference to FIG. 4A and FIG. 4B. FIG. 4A is a sectional view of the high-frequency module according to the modification of the third embodiment. FIG. 4B is a sectional view taken along one-dot chain line 4B-4B of FIG. 4A. In the present modification, as the third portion 20C of the shield structure 20, a plurality of conductor columns are used instead of a cylindrical conductor. When viewed in a plan view, the plurality of conductor columns are discretely arranged along the outer peripheral line of the opening 23. The pitch of the plurality of conductor columns is set to be narrow enough at a level that, in a frequency range of electromagnetic waves to be radiated from the high-frequency module, the conductor columns can be considered to be substantially continuous with one another in the direction in which the conductor columns are arranged, and the pitch of the plurality of conductor columns is set to be, for example, one-quarter of a wavelength. In this manner, as the third portion 20C, a plurality of conductor columns may be used instead of a cylindrical conductor.

Fourth Embodiment

A high-frequency module according to a fourth embodiment will now be described with reference to FIG. 5. The description of the configuration common to the high-frequency module according to the third embodiment (FIGS. 3A and 3B) will be omitted.

Figure 5:
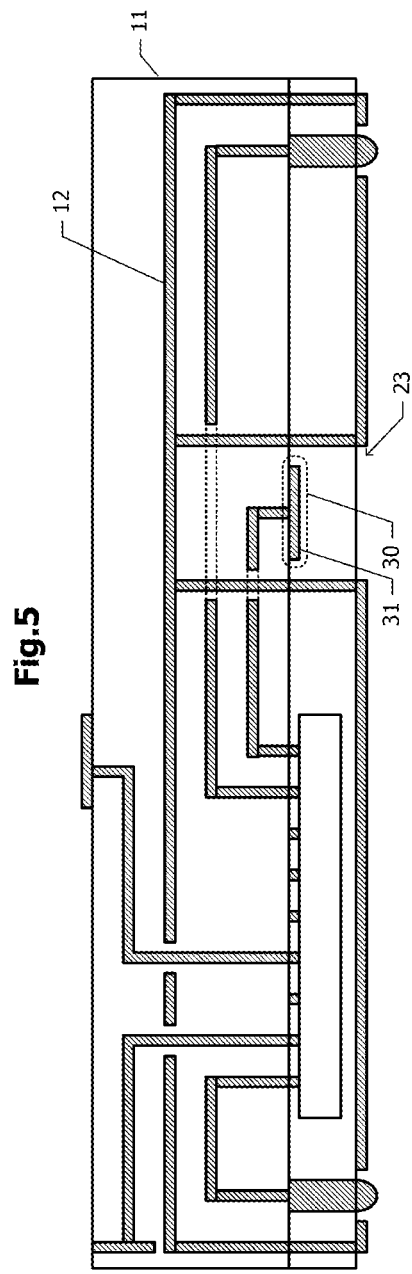
FIG. 5 is a sectional view of a high-frequency module according to a fourth embodiment.

FIG. 5 is a sectional view of the high-frequency module according to the fourth embodiment. In the fourth embodiment, a patch antenna 31 is used as the radiation-structure portion 30. The patch antenna 31 is formed on the bottom surface of the dielectric substrate 11. When viewed in a plan view, the patch antenna 31 is disposed inside the opening 23. Electromagnetic waves radiated from the patch antenna 31 pass through the opening 23 and are radiated to the outside.

The patch antenna 31 has high directivity in the opposite direction to the ground plane 12. Thus, high directivity in the downward direction with respect to the high-frequency module can be obtained.

Fifth Embodiment

A high-frequency module according to a fifth embodiment will now be described with reference to FIG. 6. The description of the configuration common to the high-frequency module according to the fourth embodiment (FIG. 5) will be omitted.

FIG. 6 is a sectional view of the high-frequency module according to the fifth embodiment. Similar to the fourth embodiment, the patch antenna 31 is used as the radiation-structure portion 30 also in the fifth embodiment. In the fifth embodiment, the patch antenna 31 is disposed on the same plane as the opening 23. For example, the first portion 20A of the shield structure 20 and the patch antenna 31 serving as the radiation-structure portion 30 are disposed on a surface of the sealing-resin layer 17. The patch antenna 31 is connected to the transmission line 32 that is disposed in the dielectric substrate 11 by a conductor column 33 that is disposed in the sealing-resin layer 17.

In the fifth embodiment, the distance from the ground plane 12 to the patch antenna 31 is larger than that in the fourth embodiment. Thus, a wider bandwidth than that of the high-frequency module according to the fourth embodiment can be achieved.

Sixth Embodiment

A high-frequency module according to a sixth embodiment will now be described with reference to FIG. 7. The description of the configuration common to the high-frequency module according to the fourth embodiment (FIG. 5) will be omitted.

FIG. 7 is a sectional view of the high-frequency module according to the sixth embodiment. In the sixth embodiment, a stacked patch antenna that includes a feed element 34A and a passive element 34B is used as the radiation-structure portion 30. Similar to the patch antenna 31 according to the fourth embodiment (FIG. 5), the feed element 34A is formed on the bottom surface of the dielectric substrate 11. The passive element 34B is disposed on the same plane as the opening 23 so as to be located inside the opening 23. For example, the passive element 34B is formed on the surface of the sealing-resin layer 17. The passive element 34B is electromagnetically coupled to the feed element 34A.

In the sixth embodiment, multiple resonance occurs between the feed element 34A and the passive element 34B, so that a wider bandwidth can be achieved.

Seventh Embodiment

A high-frequency module according to a seventh embodiment will now be described with reference to FIG. 8. The description of the configuration common to the high-frequency module according to the first embodiment (FIGS. 1A and 1B) will be omitted.

FIG. 8 is a sectional view of the high-frequency module according to the seventh embodiment. In the seventh embodiment, a slot antenna 40 that has the opening 23 serving as a slot and that has a primary resonance frequency equal to the frequency of electromagnetic waves to be radiated is used as the radiation-structure portion 30. The shield structure 20 operates as a conductor that does not have the opening 23 for electromagnetic waves in a frequency range lower than the primary resonance frequency of the slot antenna 40, and thus, favorable shielding characteristics are realized.

Eighth Embodiment

A high-frequency module according to an eighth embodiment will now be described with reference to FIG. 9A and FIG. 9B. The description of the configuration common to the high-frequency module according to the seventh embodiment (FIG. 8) will be omitted.

FIG. 9A is a sectional view of the high-frequency module according to the eighth embodiment, and FIG. 9B is a bottom view of a slot antenna portion. Although the excitation structure of the slot antenna 40 (FIG. 8) is not put into shape in the seventh embodiment, the radiation-structure portion 30 includes the slot antenna 40 and an excitation conductor 41 in the eighth embodiment. The excitation conductor 41 is connected to the high-frequency semiconductor device 13 by the transmission line 32.

The excitation conductor 41 operates as a patch antenna, so that electromagnetic waves are radiated from the excitation conductor 41. The slot antenna 40 is excited by the electromagnetic waves. When viewed in a plan view, the opening 23 of the slot antenna 40 is positioned so as to cross two opposite sides of the excitation conductor 41 having a square shape.

Ninth Embodiment

A high-frequency module according to a ninth embodiment will now be described with reference to FIG. 10A to FIG. 11B. The description of the configuration common to the high-frequency module according to the eighth embodiment (FIG. 8) will be omitted.

Figure 10A:
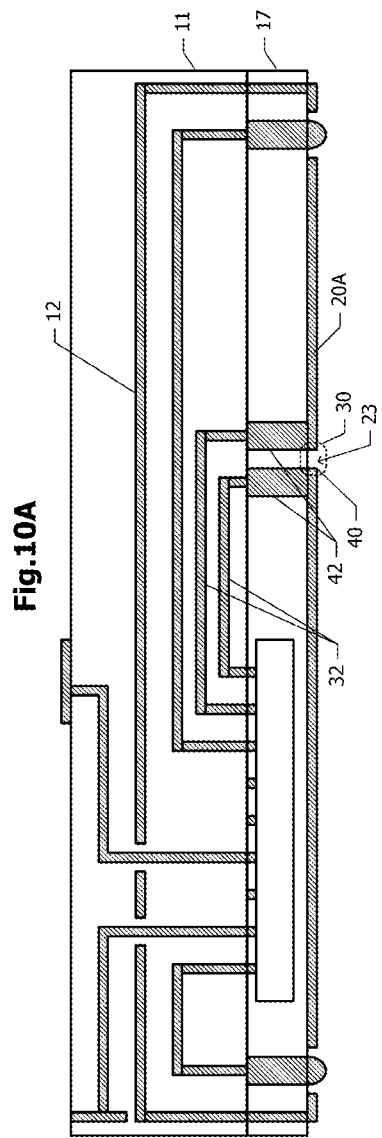
FIG. 10A is a sectional view of a high-frequency module according to a ninth embodiment.
Figure 10B:
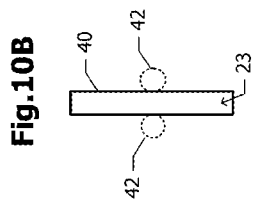
FIG. 10B is a bottom view of a slot antenna portion of the high-frequency module according to the ninth embodiment.

FIG. 10A is a sectional view of the high-frequency module according to the ninth embodiment, and FIG. 10B is a bottom view of a slot antenna portion. Although the slot antenna 40 is excited by the excitation conductor 41 (FIG. 9A and FIG. 9B) in the eighth embodiment, a differential signal is supplied from the high-frequency semiconductor device 13 to the slot antenna 40 via a differential transmission line in the ninth embodiment.

The differential transmission line includes a pair of transmission lines 32 that are disposed in the dielectric substrate 11 and a pair of conductor columns 42 that are disposed in the sealing-resin layer 17. The top surfaces of the pair of conductor columns 42 are connected to conductors that are located on opposite sides of the opening 23 (the first portion 20A of the shield structure 20). A power supplying point is located at substantially the center in the lengthwise direction of the opening 23. In the ninth embodiment, the slot antenna 40 that has the opening 23 serving as a slot is used as the radiation-structure portion 30.

Advantageous effects of the ninth embodiment will now be described. A reflection coefficient S11 and an antenna gain obtained when differential feeding was performed on the slot antenna 40 and when single-point feeding was performed on the slot antenna 40 were calculated by simulations. The simulation results will be described below.

The gap between a conductor plane in which the slot of the slot antenna 40 to be simulated was formed and the ground plane 12 was set to 0.5 mm, and the diameter of each of the conductor columns 42, which supply power to the slot antenna 40, was set to 0.25 mm. The length and the width of the opening of the slot antenna 40 in the case where differential feeding was performed were set to 2.3 mm and 0.2 mm, respectively. As a comparative example, the length and the width of the opening of the slot antenna in the case where single-point feeding was performed were set to 2.2 mm and 0.2 mm, respectively. When single-point feeding was performed, one of the pair of conductor columns was grounded.

Figure 11A:
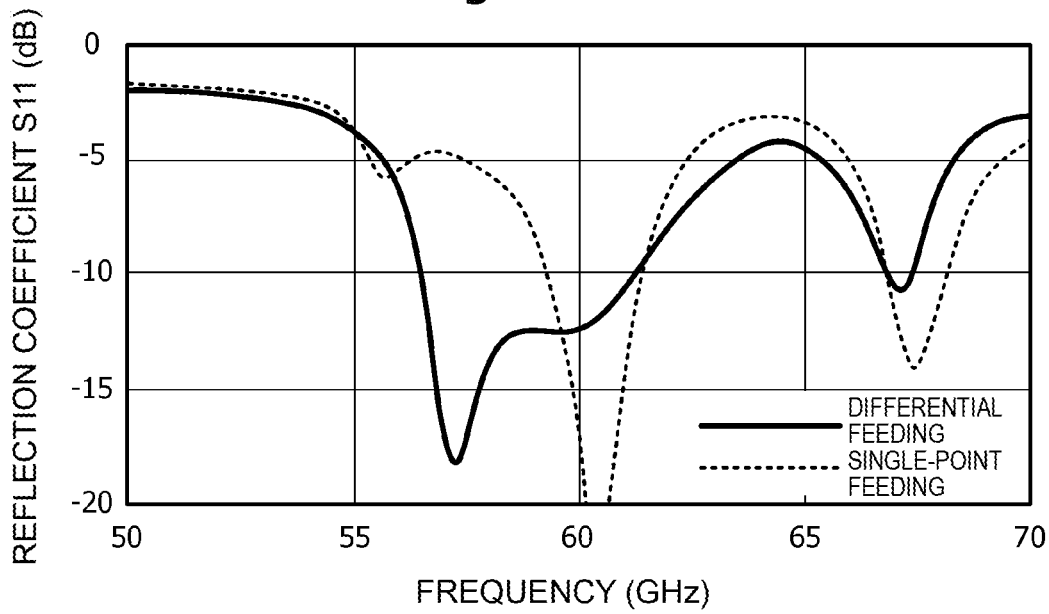
FIG. 11A is a graph illustrating a simulation result of a reflection coefficient S11.
Figure 11B:
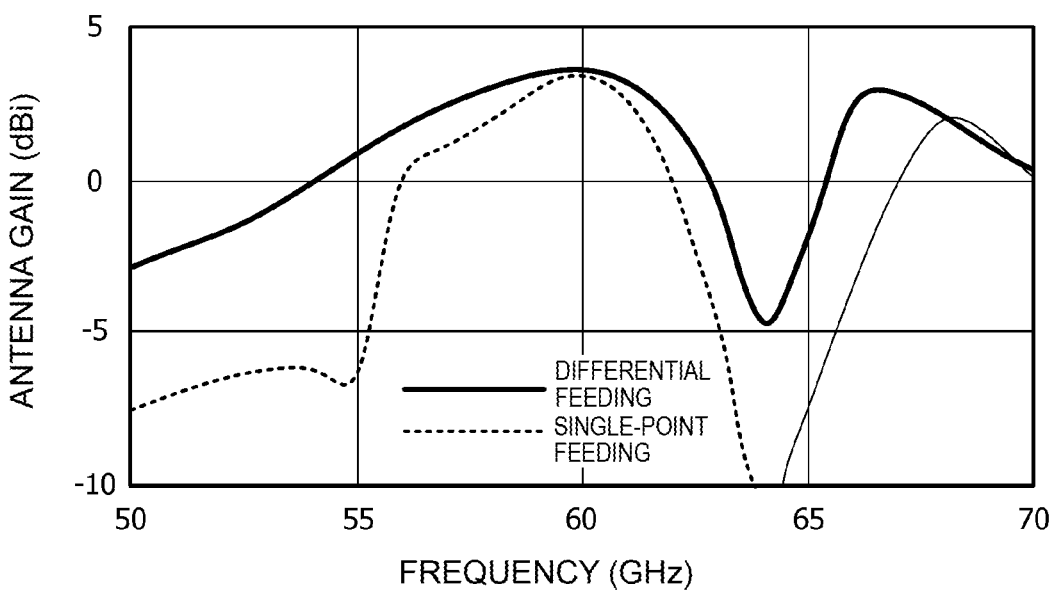
FIG. 11B is a graph illustrating a simulation result of an antenna gain.

FIG. 11A is a graph illustrating a simulation result of the reflection coefficient S11. The horizontal axis denotes the frequency expressed in units of MHz, and the vertical axis denotes the reflection coefficient S11 expressed in units of dB. FIG. 11B is a graph illustrating a simulation result of the antenna gain. The horizontal axis denotes the frequency expressed in units of MHz, and the vertical axis denotes the antenna gain expressed in units of dBi. In each of the graphs illustrated in FIG. 11A and FIG. 11B, the simulation result in the case of performing differential feeding is indicated by a solid line, and the simulation result in the case of performing single-point feeding is indicated by a dashed line.

It is understood from the simulation results (FIG. 11A) of the reflection coefficient S11 that, by performing differential feeding, a wider bandwidth than that in the case of performing single-point feeding is achieved. In addition, it is understood from the simulation results (FIG. 11B) of the antenna gain that, by performing differential feeding, a higher antenna gain than that in the case of performing single-point feeding is obtained.

In the ninth embodiment, since differential feeding is performed on the slot antenna 40, a wider bandwidth and a higher gain can be achieved. In addition, in the case where a differential transmission line is used for supplying power, an electromagnetic field concentrates in the vicinity of the pair of transmission lines 32 and the pair of conductor columns 42. Thus, the probability of occurrence of interference of high-frequency signals in the space surrounded by the shield structure 20 and the ground plane 12 can be reduced.

In each of the above-described first to ninth embodiments, although the single opening 23 is formed in the shield structure 20, a plurality of openings 23 may be formed. In this case, the radiation-structure portion 30 may be provided for each of the plurality of openings 23. For example, an array antenna can be formed of a plurality of radiation-structure portions 30 and the plurality of openings 23.

Each of the above-described embodiments is an example, and it is obvious that the configurations according to the different embodiments may be partially replaced with one another or may be combined with one another. Similar advantageous effects obtained in similar configurations according to the plurality of embodiments will not be described in every embodiment. In addition, the present disclosure is not limited to the above-described embodiments. For example, it is obvious to those skilled in the art that various changes, improvements, and combinations may be made to the present disclosure.

11 dielectric substrate
    12 ground plane
    13 high-frequency semiconductor device
    14 via conductor
    15 conductor column
    16 input/output terminal
    17 sealing-resin layer
    18 via conductor
    20 shield structure
    20A first portion
    20B second portion
    20C third portion 30 radiation-structure portion
31 patch antenna
32 transmission line
33 conductor column
34A feed element
34B passive element
35, 36 upper radiating element
37, 38 transmission line
40 slot antenna
41 excitation conductor
42 conductor column

The invention claimed is:

1. A high-frequency module comprising:
a dielectric substrate;
a ground plane provided in the dielectric substrate or on a top surface of the dielectric substrate;
a high-frequency semiconductor device mounted on a bottom surface of the dielectric substrate;
a shield structure provided in a space closer to the bottom surface than the ground plane is and surrounding the high-frequency semiconductor device from below and from side of the high-frequency semiconductor device, the shield structure being connected to the ground plane and having an opening;
a radiation-structure portion for radiating a high-frequency signal outputted by the high-frequency semiconductor device as electromagnetic waves through the opening; and
an upper radiating element provided at a portion of the dielectric substrate above the ground plane and driven by the high-frequency semiconductor device.

2. The high-frequency module according to claim 1, wherein the shield structure includes a first portion disposed below the high-frequency semiconductor device so as to be parallel to the dielectric substrate and a second portion connecting the first portion and the ground plane to each other, and
wherein the opening is provided in the first portion.

3. The high-frequency module according to claim 1, wherein the radiation-structure portion includes a patch antenna disposed in a space surrounded by the ground plane and the shield structure and radiating electromagnetic waves toward the opening.

4. The high-frequency module according to claim 1, wherein the radiation-structure portion includes
a feed element disposed in a space surrounded by the ground plane and the shield structure, wherein power is supplied to the feed element by the high-frequency semiconductor device and
a passive element disposed on a same plane as the opening so as to be located inside the opening and electromagnetically coupled to the feed element.

5. The high-frequency module according to claim 1, wherein the radiation-structure portion includes
a patch antenna disposed on a same plane as the opening so as to be located inside the opening,
a conductor column extending from the bottom surface of the dielectric substrate so as to reach the patch antenna, and
a transmission line through which a high-frequency signal is transmitted from the high-frequency semiconductor device to the conductor column.

6. The high-frequency module according to claim 1, wherein the radiation-structure portion includes a slot antenna having the opening serving as a slot.

7. The high-frequency module according to claim 6, wherein the radiation-structure portion includes an excitation conductor disposed in a space shielded by the shield structure and exciting the slot antenna.

8. The high-frequency module according to claim 6, wherein the radiation-structure portion includes a differential transmission line through which a differential signal is supplied from the high-frequency semiconductor device to the slot antenna.

9. The high-frequency module according to claim 3, wherein the radiation-structure portion includes a patch antenna disposed in a space surrounded by the ground plane and the shield structure and radiating electromagnetic waves toward the opening.

10. The high-frequency module according to claim 3, wherein the radiation-structure portion includes
a feed element disposed in a space surrounded by the ground plane and the shield structure, wherein power is supplied to the feed element by the high-frequency semiconductor device and
a passive element disposed on a same plane as the opening so as to be located inside the opening and electromagnetically coupled to the feed element.

11. The high-frequency module according to claim 3, wherein the radiation-structure portion includes
a patch antenna disposed on a same plane as the opening so as to be located inside the opening,
a conductor column extending from the bottom surface of the dielectric substrate so as to reach the patch antenna, and
a transmission line through which a high-frequency signal is transmitted from the high-frequency semiconductor device to the conductor column.

12. The high-frequency module according to claim 3, wherein the radiation-structure portion includes a slot antenna having the opening serving as a slot.

* * * * *